United States Patent [19]

Tanski

[11] Patent Number: 4,890,369

[45] Date of Patent: Jan. 2, 1990

[54] METHOD OF MANUFACTURING SAW DEVICES

[75] Inventor: William J. Tanski, Glastonbury, Conn.

[73] Assignee: United Technologies Corporation, Hartford, Conn.

[21] Appl. No.: 263,933

[22] Filed: Oct. 28, 1988

[51] Int. Cl.$^4$ ............................................. H01L 41/22
[52] U.S. Cl. ................................. 29/25.35; 29/593; 156/627; 156/632; 156/651; 310/313 B; 310/313 D; 427/100
[58] Field of Search ............................. 29/25, 35, 593; 310/313 B, 313 D, 313 R, 313 C; 156/627, 632, 651; 427/100

[56] References Cited

U.S. PATENT DOCUMENTS

| | | | |
|---|---|---|---|
| 4,130,813 | 12/1978 | Sandy et al. | 29/25.35 X |
| 4,364,016 | 12/1982 | Tanski | 29/25.35 X |
| 4,672,254 | 6/1987 | Dolat et al. | 29/25.35 X |
| 4,773,138 | 9/1988 | Ballato et al. | 29/25.35 |

Primary Examiner—Carl E. Hall
Attorney, Agent, or Firm—Peter R. Ruzek

[57] ABSTRACT

A method of manufacturing surface acoustic wave devices includes providing a dielectric substrate with a plurality of channels which open onto a substrate surface region and each of which accommodates a metallic electrode, the electrodes being recessed below the substrate surface region by an actual distance which at least equals a desired distance at which the electrodes have a minimum acoustic reflectivity, testing the performance of the device to ascertain at least the acoustic reflectivity of the electrodes, and etching at least the dielectric substrate, when it is ascertained during the testing that the acoustic electrode reflectivity is excessive, at least at the substrate surface region to a predetermined etching depth. The use of this method results in a device having reduced post-etching acoustic electrode reflectivity as a result of the thus obtained reduction in the difference between the actual and desired distances.

3 Claims, 2 Drawing Sheets

METHOD OF MANUFACTURING SAW DEVICES

DESCRIPTION

TECHNICAL FIELD

The present invention relates to surface acoustic wave (SAW) devices in general, and more particularly to a method of manufacturing low-loss SAW devices and to SAW devices obtained by using this method.

BACKGROUND ART

There are already known various constructions of surface acoustic wave devices, among them such using quarter wavelength electrodes or eighth wavelength (split) electrodes. The electrodes of such SAW devices may be situated on a surface region of a dielectric substrate, or they may at least partially penetrate below such surface region and into the substrate proper.

It is known to change the operating frequency of a SAW device (see an article by W. J. Tanski published in Applied Physics Letters, 39(1) (1981) and entitled "Surface Acoustic Wave Frequency Trimming of Resonant and Traveling Wave devices on Quartz"), in an iterative manner, from that at which the device operates as manufactured to that at which the device is supposed to operate when in use. The frequency trimming technique disclosed in this article involves etching of the quartz substrate between the metallic electrodes to a certain depth which depends on the extent of deviation of the actual operating frequency from that desired. This etching results in an increase in the size of the steps between the electrodes and the quartz, with attendant velocity decrease which, in turn, causes the operating frequency to go down. An additional result of the step size increase is an increase in the transducer reflectivity when the SAW device is a resonator.

While this article mentions that it is usually desirable to reduce the SAW reflectivity of the transducers in resonators formed on quartz, not only does it fail to specifically disclose how such reflectivity reduction could be achieved, but it also proposes deliberately to increase the transducer reflectivity in order to accomplish the desired goal, that is, to trim the resonance frequency downward. Furthermore, in the SAW device constructions disclosed in this article, reflectivity can never be reduced by etching, no matter how great the amount of etching may be.

Now, SAW filters made on quartz, especially those that are to be used in the VHF, UHF and L band frequency ranges, must have the mechanical or acoustic reflectivity of the electro-acoustic transducer electrodes reduced to a negligible amount in order to ensure the desirable response in a relatively easily reproducible manner. An approach that is often used to reduce electrode reflectivity is to employ eighth wavelength (or split) electrodes. However, this approach works to satisfaction only in the frequency range up to about 400 MHz; above this frequency range, split electrodes cannot, for all intents and purposes, be employed inasmuch as they would require linewidths between 0.25 and 1 micron, which is at if not beyond the limit of what can be reliably achieved, at least at the present time.

The acoustic reflectivity of SAW device electrodes, especially of quarter wavelength aluminum electrodes on quartz, can be reduced by recessing the electrodes in the substrate in such a manner that a groove is first etched in the substrate at the contemplated location of the respective electrode, and then this groove is filled with the electrode metal. This technique is quite effective, but the quality of the result is highly dependent on the accuracy and reproducibility of the fabrication procedures. Experience has shown that the yield of high quality recessed electrode SAW filters obtained when using the aforementioned fabrication technique is quite low.

Accordingly, it is a general object of the present invention to avoid the disadvantages of the prior art.

More particularly, it is an object of the present invention to provide a method of making SAW devices, which method does not have the disadvantages of the known methods of this kind.

Still another object of the present invention is to develop the method of the type here under consideration in such a manner as to dramatically increase the yield of high-quality SAW devices from a batch of such devices obtained by following the recessed-electrode fabrication technique.

It is yet another object of the present invention to devise a method of the above type which renders it possible to keep the difference between the actual and the desired acoustic reflectivity in SAW devices to a minimum.

A concomitant object of the present invention is to design the SAW device in such a manner as to lend itself to a performance of the above method thereon while still being relatively simple in construction, inexpensive to manufacture, easy to use, and at least as reliable in operation as prior-art SAW devices.

DISCLOSURE OF THE INVENTION

In keeping with these objects and others which will become apparent hereafter, one feature of the present invention resides in a method of manufacturing surface acoustic wave devices, this method comprising the steps of providing a dielectric substrate with a plurality of channels which open onto a substrate surface region and each of which accommodates a metallic electrode, the electrodes being recessed below the substrate surface region by an actual distance which at least equals but usually exceeds a desired distance at which the electrodes have a minimum acoustic reflectivity; testing the performance of the device to ascertain at least the acoustic reflectivity of the electrodes; and etching at least the dielectric substrate, when it is ascertained during the testing step that the acoustic electrode reflectivity is excessive, at least at the substrate surface region to a predetermined etching depth, with attendant reduction in the difference between the actual and desired distances and commensurate reduction in the post-etching acoustic electrode reflectivity.

The present invention also relates to a surface acoustic wave device which comprises a dielectric substrate having a plurality of channels which open onto a substrate surface region, and a plurality of metallic electrodes each accommodated in one of the channels. In accordance with the invention, the electrodes are recessed below the substrate surface region by an operating distance which is in an acceptable range from a desired distance at which the electrodes have a minimum acoustic reflectivity, this operating distance being obtained by initially recessing the electrodes below the substrate surface region by an actual distance which at least equals but usually exceeds the desired distance, then testing the performance of the device to ascertain at least the acoustic reflectivity of the electrodes, and finally etching at least the dielectric substrate, when it is ascertained during the testing that the acoustic electrode reflectivity is excessive, at least at the substrate surface region to a predetermined etching depth, with attendant reduction in the difference between the actual and desired distances and commensurate reduction in the post-etching acoustic electrode reflectivity.

It will be appreciated that the present invention is based on the recognition of the fact that excellent (i.e. extremely low) acoustic reflectivity can be obtained in SAW devices even if physical steps exist between the adjacent electrodes and the intervening portions of the substrate, so long as it is the intervening portions that project beyond the electrodes and not the other way around. Based on this recognition, the present invention then proposes to deliberately make most if not all of the intervening substrate portions higher than desired in the finished SAW device, and to etch away as much of such intervening substrate portions as necessary to obtain the desired response and particularly the desired low acoustic or mechanical reflectivity.

BRIEF DESCRIPTION OF THE DRAWING

The present invention will be described in more detail below with reference to the accompanying drawing in which.

BEST MODE FOR CARRYING OUT THE INVENTION

Figure 1:
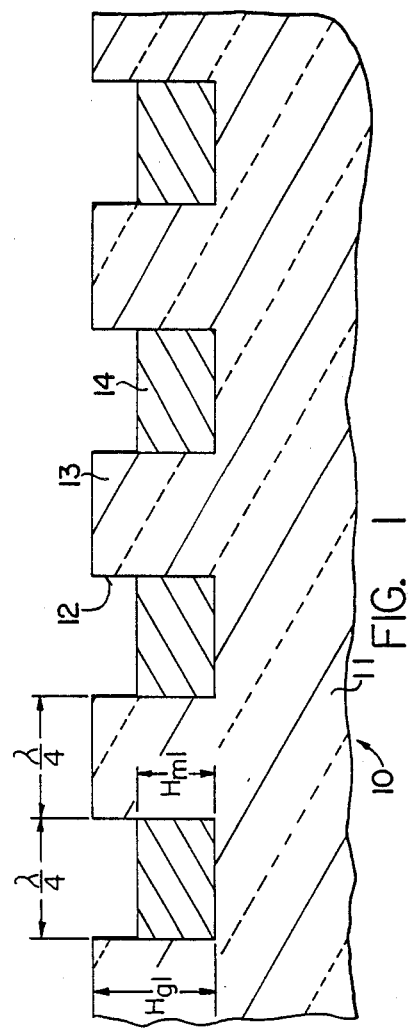
FIG. 1 is a fragmentary sectional view of a surface acoustic wave device preform fabricated in accordance with the present invention.

Referring now to the drawing in detail, and first to FIG. 1 thereof, it may be seen that the reference numeral 10 has been used therein to identify a preform of a surface acoustic wave (SAW) device, such as a filter. The SAW device preform 10 comprises, as one of its constituent components, a substrate 11 which is made of a dielectric material, preferably of quartz. The substrate 11 is provided at its surface region with a plurality of recesses or channels 12 which open onto the aforementioned surface region. The recesses 12 are separated from one another by respective intervening substrate portions 13. In the illustrated construction of the SAW device preform 10, the recesses 12 and the intervening substrate portions 13 have widths, as considered in the plane of the drawing, amounting to a quarter wavelength of the acoustic wave at the operating frequency.

Each of the recesses 12 accommodates an electrode 14 made of an electrically conductive metallic material, preferably of aluminum. In an initial condition or configuration of the SAW device preform 10, which is illustrated in FIG. 1, the intervening substrate portions 13 have heights $H_{g1}$, as measured from the bottoms of the recesses 12 to the tops of the intervening portions 13, which exceed the corresponding heights $H_{m1}$ of the electrodes 14 to an extent significantly greater than that desired in the finished SAW device. Thus, the heights $H_{g1}$ and $H_{m1}$ may amount to 800 and 600 angstroms, respectively.

The SAW device preform 10 is fabricated by employing standard processing techniques. So, for instance, a technique may be used in accordance with which a single crystal quartz substrate is coated with photoresist and the photoresist is then exposed using a photomask carrying the requisite masking pattern, and developed. The electrode line pattern is then etched into the quartz substrate through the exposed and developed photoresist to a depth of about 800 angstroms. Then, the thus obtained substrate 11 with the recesses or lines 12 therein and with the top surfaces of the portions 13 still covered with the photoresist is coated with about 600 angstroms of aluminum (containing 2 to 4% of copper to minimize electromigration) and the photoresist is lifted off, together with the aluminum layer regions covering the photoresist, so that only the aluminum layer portions accommodated in the recesses 12 remain to constitute the electrodes 14.

Now, if it were possible to exactly control the depth of the electrode recess pattern etching, the thickness of the deposited aluminum layer and other parameters of the aforementioned method steps, there would be no need for giving the intervening substrate portions 13 an excessive height($H_{g1}-H_{m1}$) over the electrodes 14 since the actual performance of the SAW device, including the acoustic reflectivity of the electrodes 14, would exactly correspond to that desired. Yet, in actual practice, it is impossible so exactly to control the aforementioned parameters so that the actual performance of the SAW devices will vary not only from one batch of such devices to another, but also from one device to another within the same batch that has been subjected to identical overall processing conditions. This results in a situation where, if it were attempted to fabricate the SAW devices to exact specifications, the yield (i.e. the average number of devices that actually perform in the desired manner) would be very low, such as only 5% or less, most if not all of the remainder being discards since such unsatisfactory devices could not be salvaged.

Based on the recognition of this undesirable situation, the present invention proposes deliberately to make the aimed-for height difference $H_{g1}-H_{m1}$ excessive, that is, greater than that which should exist in the finished device, by such an amount that, in spite of the differences in the processing parameters from one device to another in the same batch, or from batch to batch, the actual height difference obtained after the performance of the above-mentioned steps will be equal to or greater than the desired final difference at least for a predominant majority, if not for all, of the devices.

Obviously, when this expedient is resorted to, the actual height difference will indeed be excessive for most of the devices, with the result that the performance of such excessive-height devices will be unsatisfactory; yet, because of the inherent vagaries of the above fabrication procedures, it may happen that a small number of the devices will exhibit the requisite operating response. Therefore, it is proposed in accordance with the present invention to test all of the devices fabricated in the above manner after the completion of the aforementioned steps to determine the operating characteristics of such devices and particularly the acoustic or mechanical reflectivity of the electrodes 14 of such devices. Testing may be performed by the use of a probing station connected to a network analyzer, thus making any form of packaging, wire bonding, or die separation unnecessary. When this testing indicates that some of the thus obtained devices (i.e. as fabricated) already perform to satisfaction, it is not necessary to subject them to the procedures described below and they are, in fact, not subjected to such follow-up or trimming procedures, either by removing them from the affected batch, or by protecting them from the effects of the subsequent procedures, such as by coating them.

Figure 2:
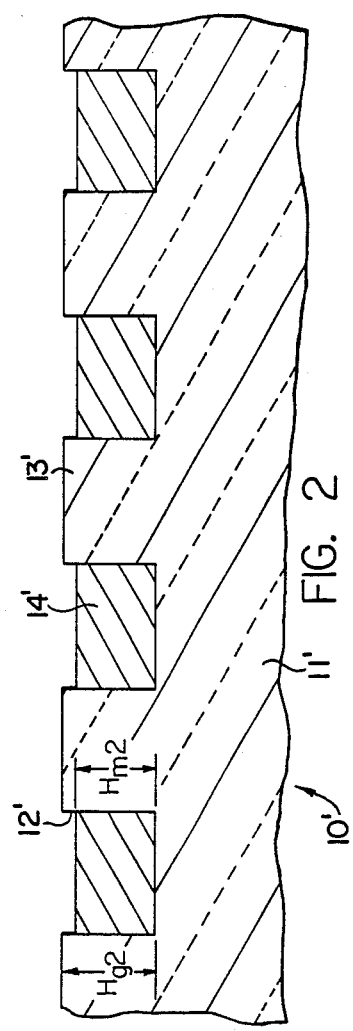
FIG. 2 is a view similar to that of FIG. 1 but depicting a finished SAW device as obtained by performing the method of the present invention.

On the other hand, the devices with respect to which the testing reveals that their operating characteristics, especially their acoustic reflectivity, is too high, are subjected to a trimming procedure the result of which is a finished device 10' which is shown in FIG. 2 of the drawing in which the same reference numerals as before but supplemented with primes to indicate the difference between a preform and a finished article have been used to identify corresponding parts. The trimming procedure basically involves reducing the aforementioned height difference by selective etching, in one or more etching steps, until the desired operating characteristics are obtained. This occurs when the height of the intervening substrate portions 13' is reduced to $H_{g2}$ and the height of the electrodes 14' amounts to $H_{m2}$ which may be only slightly less than the initial electrode height $H_{m1}$ in view of the selectivity of the etching operation which affects the metallic material of the electrodes 14 to a much lesser extent than the material of the substrate portions 13, if at all. Typically, reactive ion etching process using a gaseous mixture of dichloro-difluoromethane-$CF_4$ with 10 to 20% of oxygen is being used to etch the substrate portions 13 at a much faster rate than the electrodes 14.

After the trimming, the thus trimmed device 10' is tested again to establish its performance or operating characteristics, and this etching and testing sequence is repeated until the respective device 10' performs to satisfaction. As for the devices 10' that have been found to be satisfactory, they are not subjected to any further etching steps, again by either covering them up by a protective layer, or by removing them from the batch. The above-described trimming procedure, which so far has achieved the best results, is iterative in character, that is, it is performed in relatively small, and usually uniform, steps, with the operating characteristics of the devices 10' being tested after each etching step until satisfactory results are obtained. However, it will be appreciated that it would also be possible, even though possibly more cumbersome and less reliable, to control the trimming etch procedure and particularly the magnitude of the etching step or steps in dependence on the thickness of the material to be removed from the intervening portions 13, that is, on the difference between the initial height difference $H_{g1}-H_{m1}$ and the desired height difference $H_{g2}-H_{m2}$.

For single devices it is also possible to mount the devices in the trimming station, connect the device to a network analyzer, and perform the trimming etch in one step by etching the device until the desired response is seen on the network analyzer. This type of 'in situ' real time etching is actually done with the SAW resonators to set the resonance frequency.

Figure 3:
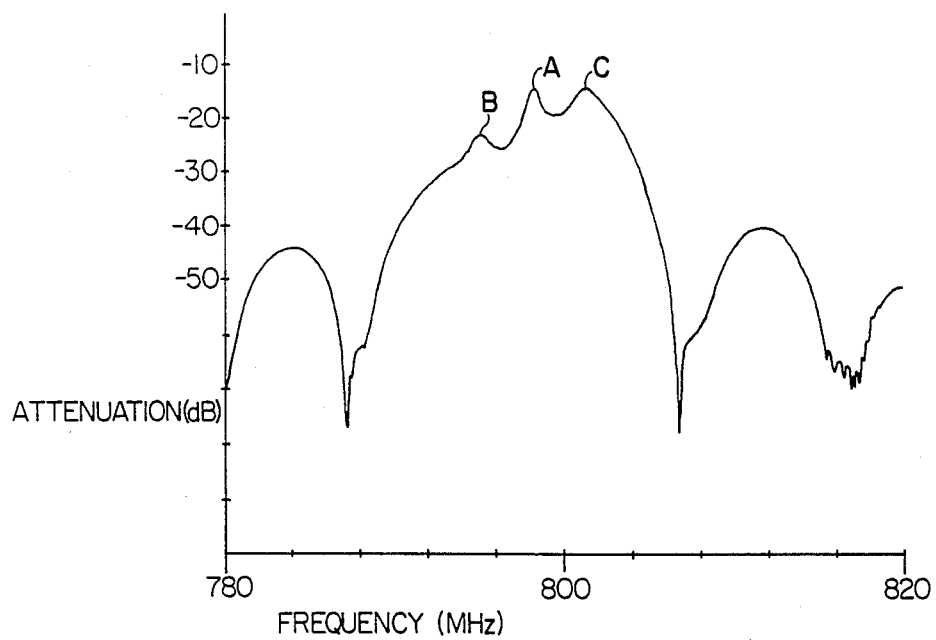
FIG. 3 is a graphic representation of a response characteristic of the preform of FIG. 1.
Figure 4:
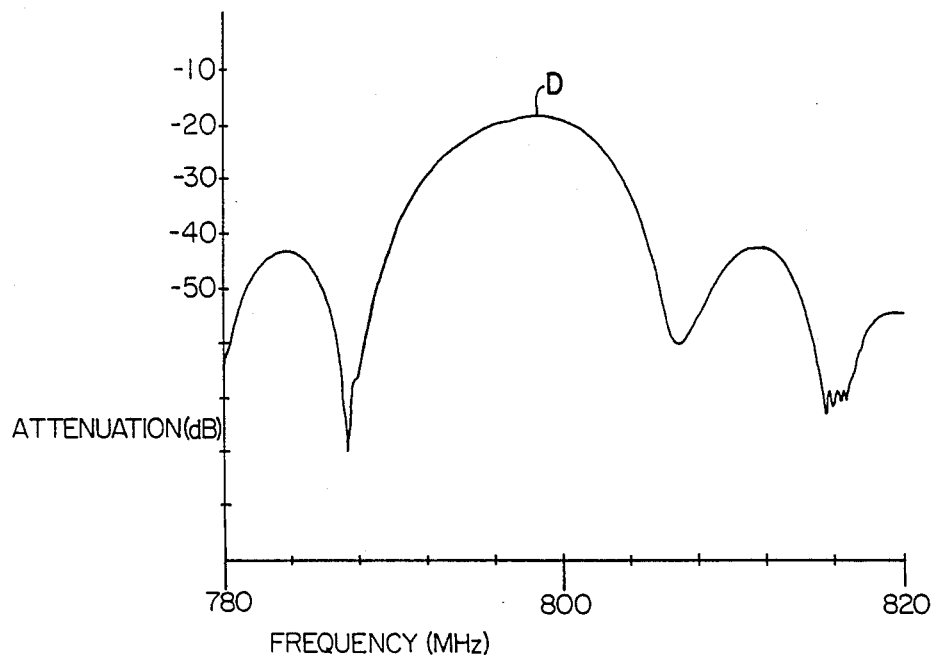
FIG. 4 is a diagrammatic view similar to that of FIG. 3 but showing the response characteristic of the finished device of FIG. 2.

FIG. 3 of the drawing illustrates the performance of a typical SAW device preform 10 prior to the aforementioned trimming procedure, showing attenuation as a function of frequency. It may be seen that, in addition to having an attenuation minimum at the desired frequency (point A), the response curve of the preform 10 also exhibits two additional attenuation minimums (at points B and C). On the other hand, FIG. 3 shows a corresponding relationship for a finished device 10', wherein the attenuation increases smoothly from a minimum at the desired operating frequency (point D) both toward higher and lower frequencies. This means that the SAW device 10 sharply discriminates between its center or operating frequency and frequencies both above and below the center frequency.

While the present invention has been illustrated and described as embodied in a particular construction of a surface acoustic wave device, i.e. a filter, it will be appreciated that the present invention is not limited to this particular example; rather, the scope of protection of the present invention is to be determined solely from the attached claims.

I claim:

1. A method of manufacturing surface acoustic wave devices, comprising the steps of
   providing a dielectric substrate with a plurality of channels which open onto a substrate surface region and each of which accommodates a metallic electrode, the electrodes being recessed below the substrate surface region by an actual distance which at least equals a desired distance at which the electrodes have a minimum acoustic reflectivity;
   testing the performance of the device to ascertain at least the acoustic reflectivity of the electrodes; and
   etching at least the dielectric substrate, when it is ascertained during said testing step that the acoustic electrode reflectivity is excessive, at least at the substrate surface region to a predetermined etching depth, with attendant reduction in the difference between the actual and desired distances and commensurate reduction in the post-etching acoustic electrode reflectivity.

2. The method as defined in claim 1, and further comprising repeating said testing and etching steps until the acoustic electrode reflectivity is within acceptable range from the minimum acoustic reflectivity.

3. The method as defined in claim 1, and further comprising the step of controlling said etching step in such a manner that the etching depth depends on the extent of deviation of the acoustic electrode reflectivity as ascertained during said testing step from the minimum acoustic reflectivity.

* * * * *